(12) United States Patent
Benjaram et al.

(10) Patent No.: US 10,840,934 B2
(45) Date of Patent: Nov. 17, 2020

(54) METHODS AND APPARATUS FOR A SUCCESSIVE APPROXIMATION REGISTER ANALOG-TO-DIGITAL CONVERTER

(71) Applicant: SEMICONDUCTOR COMPONENTS INDUSTRIES, LLC, Phoenix, AZ (US)

(72) Inventors: Rajashekar Benjaram, Bangalore (IN); Maheedhar Suryadevara, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/777,035

(22) Filed: Jan. 30, 2020

(65) Prior Publication Data
US 2020/0321971 A1 Oct. 8, 2020

(30) Foreign Application Priority Data

Apr. 3, 2019 (IN) .............................. 201911013432

(51) Int. Cl.
| | |
|---|---|
| *H03M 1/10* | (2006.01) |
| *H03M 1/06* | (2006.01) |
| *H03M 1/12* | (2006.01) |
| *H03M 1/00* | (2006.01) |

(52) U.S. Cl.
CPC ........... *H03M 1/1033* (2013.01); *H03M 1/06* (2013.01); *H03M 1/00* (2013.01); *H03M 1/1009* (2013.01); *H03M 1/12* (2013.01)

(58) Field of Classification Search
CPC ........ H03M 1/1009; H03M 1/06; H03M 1/12; H03M 1/00

USPC ................................. 341/120, 118, 155, 166
See application file for complete search history.

(56) References Cited

U.S. PATENT DOCUMENTS

| | | | |
|---|---|---|---|
| 2015/0084800 A1* | 3/2015 | Zhang ................. | H03M 1/0624 341/155 |
| 2015/0146055 A1 | 5/2015 | Sampath | |

OTHER PUBLICATIONS

Wenbo Liu, et al., A 12-bit 50-MS/s 3.3-mW SAR ADC with background digital calibration, IEEE conference article, Sep. 9-12, 2012, Proceedings of the IEEE 2012 Custom Integrated Circuits Conference, San Jose, California.
Dai Zhang, et al., Analysis and Calibration of Nonbinary-Weighted Capacitive DAC for High-Resolution SAR ADCs, IEEE article, Sep. 2014, pp. 666-670, vol. 61, No. 9, IEEE Transactions on Circuits and Systems-II: Express Briefs.
P. J. A. Harpe, Concepts for smart AD and DA converters, Eindhoven: Technische Universiteit Eindhoven, thesis, Jan. 1, 2010, Eindhoven University of Technology, The Netherlands.

* cited by examiner

*Primary Examiner* — Joseph J Lauture
(74) *Attorney, Agent, or Firm* — The Noblitt Group, PLLC; Hettie L. Haines

(57) ABSTRACT

Various embodiments of the present technology may provide methods and apparatus for a successive approximation register analog-to-digital converter (SAR ADC). The SAR ADC may provide a first digital calibration circuit configured to correct systemic mismatch and a second digital calibration circuit configured to correct random mismatch. Together, the first and second digital calibration circuits resolve missing codes in the SAR ADC output.

20 Claims, 9 Drawing Sheets

METHODS AND APPARATUS FOR A SUCCESSIVE APPROXIMATION REGISTER ANALOG-TO-DIGITAL CONVERTER

CROSS-REFERENCE TO RELATED APPLICATION

This application claims the benefit of Indian Provisional Patent Application No. 201911013432, filed on Apr. 3, 2019, the contents of which are incorporated by reference.

BACKGROUND OF THE TECHNOLOGY

In a SAR ADC (successive approximation register analog-to-digital converter), systematic and random mismatch of capacitors results in integral non-linearity (INL) and differential non-linearity (DNL) (missing codes). In general, the SAR ADC equation may be represented by:

$$v_{in} \sum_{i=0}^{12} \left(\frac{C_i}{C_T}\right) \times b_i \times V_{Ref},$$

where $C_i$ is the capacitance of the switching bit $b_i$, and $C_T$ is the total capacitance. In other words, $$\frac{v_{in}}{V_{Ref}} \sum_{i=0}^{12} \left(\frac{2^i}{2^{12}} \times b_i\right)$$

(assume an ideal case where $C_i=2*C_{i-1}$, $C_0$ is the unit capacitance). In a case of an SAR ADC with $$C_i < \sum_{k=0}^{i-1} C_k,$$

where $C_i=2*C_{i-1}-\Delta C_i$, the SAR ADC has a negative DNL and has an ADC output curve represented by FIG. 9. This non-linearity negatively impacts the signal-to-noise ratio (SNR), which may cause image artifacts when used in an imaging system. Therefore, it may be desired to resolve the missing codes to reduce nonlinearity and improve the SNR.

SUMMARY OF THE INVENTION

Various embodiments of the present technology may provide methods and apparatus for a successive approximation register analog-to-digital converter (SAR ADC). The SAR ADC may provide a first digital calibration circuit configured to correct systemic mismatch and a second digital calibration circuit configured to correct random mismatch. Together, the first and second digital calibration circuits resolve missing codes in the SAR ADC output.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 3:
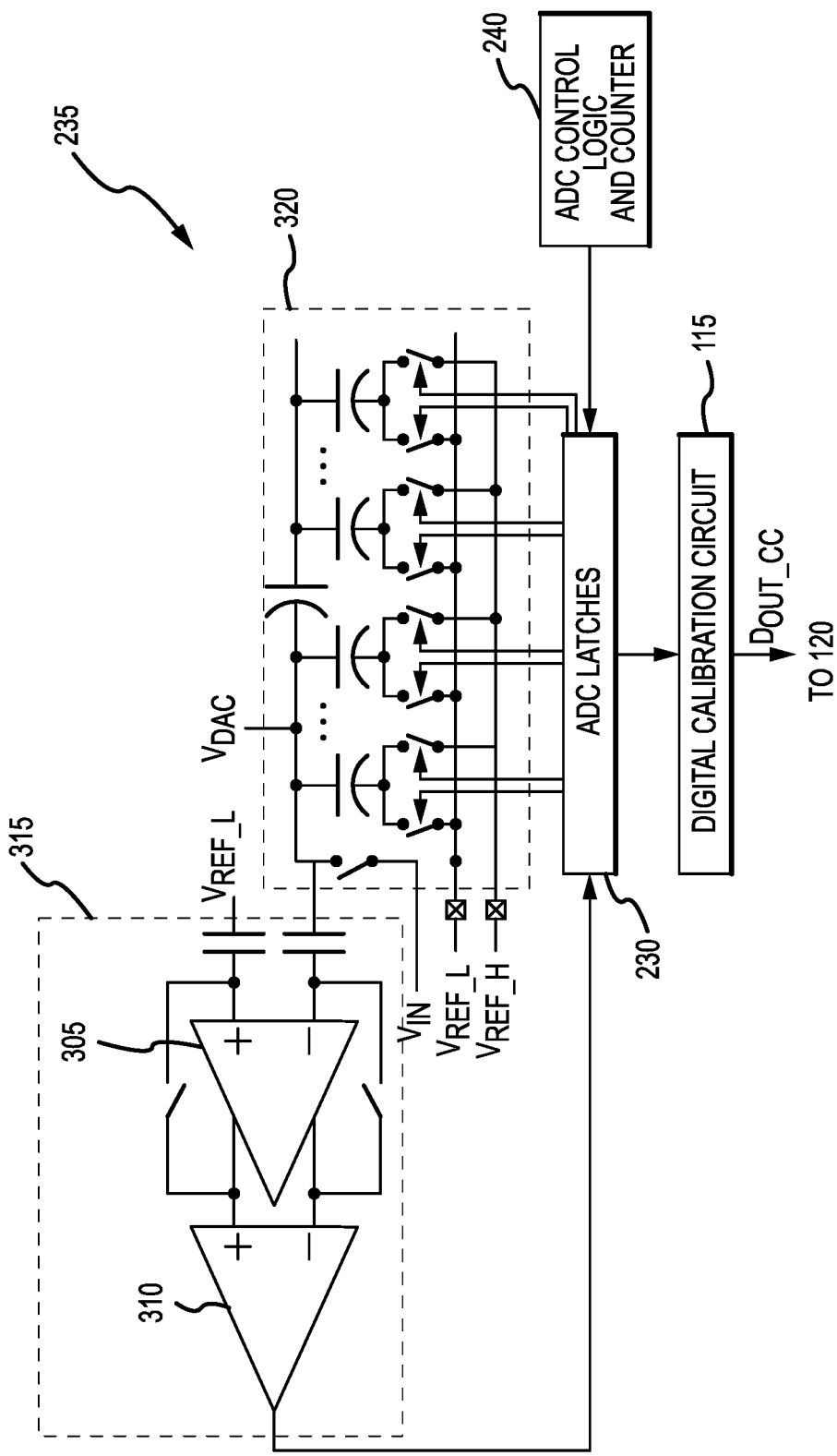
FIG. 3 is a circuit diagram of a SAR ADC in accordance with an exemplary embodiment of the present technology.
Figure 4:
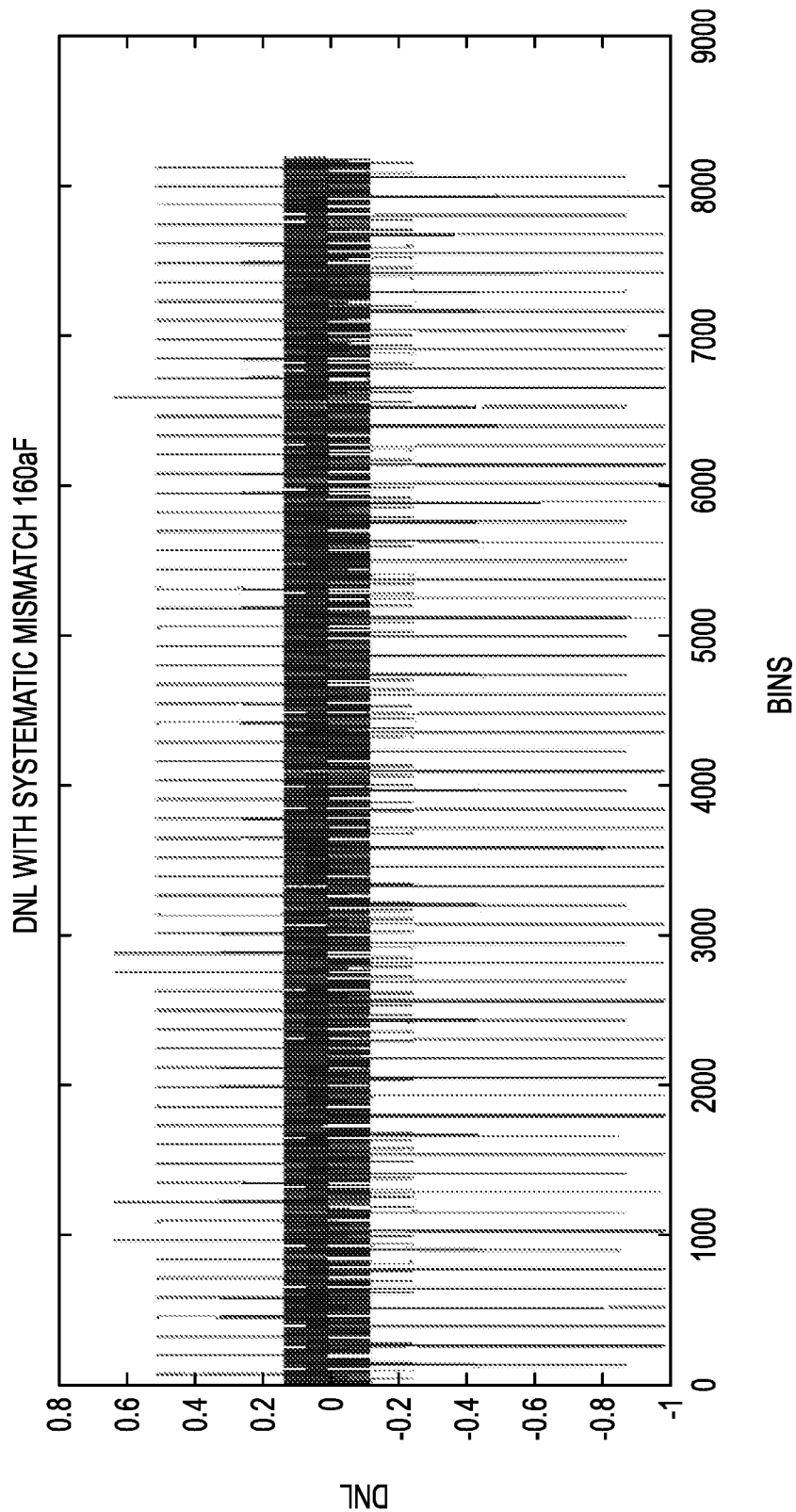
Figure 5:
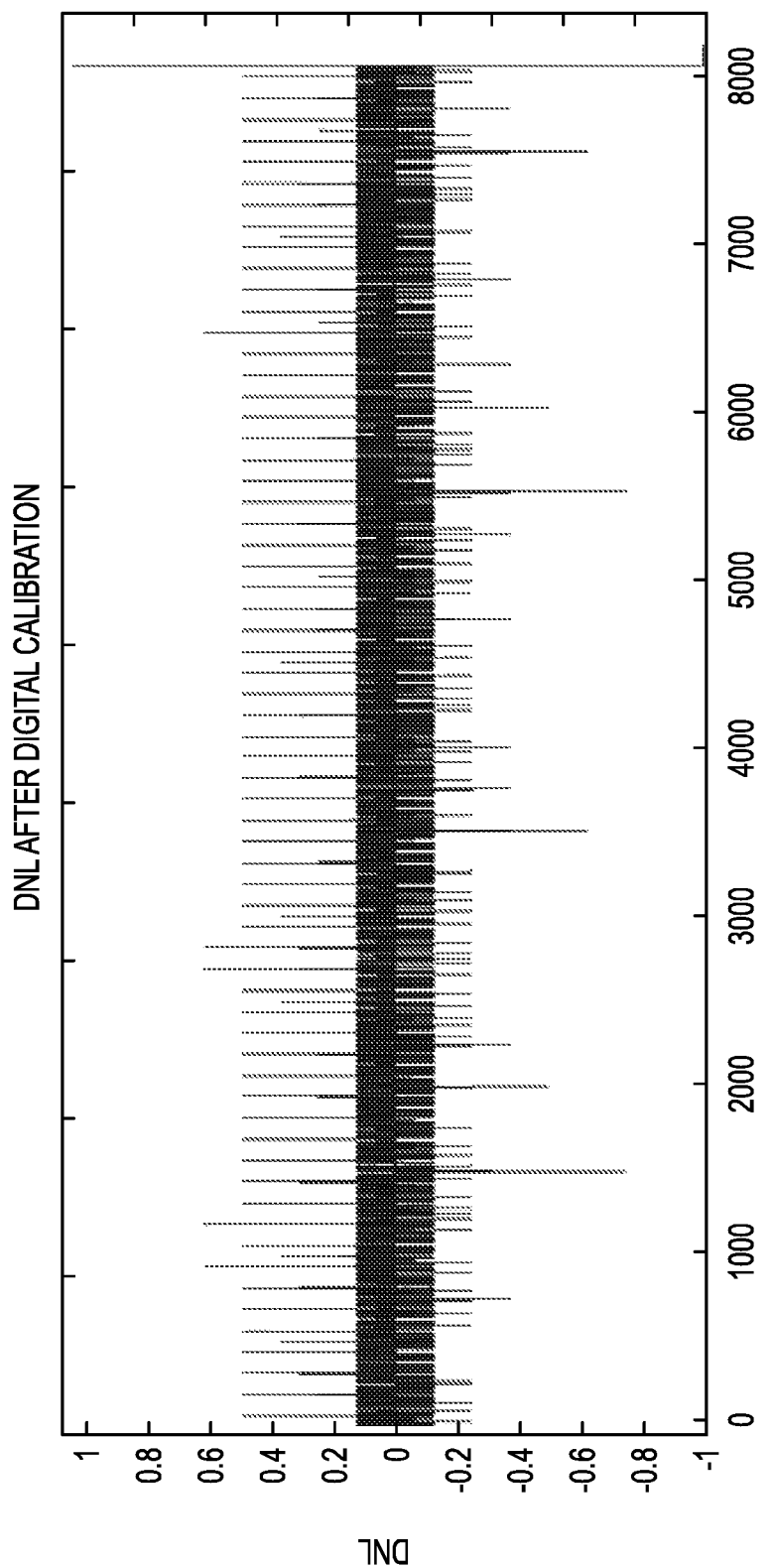
Figure 6:
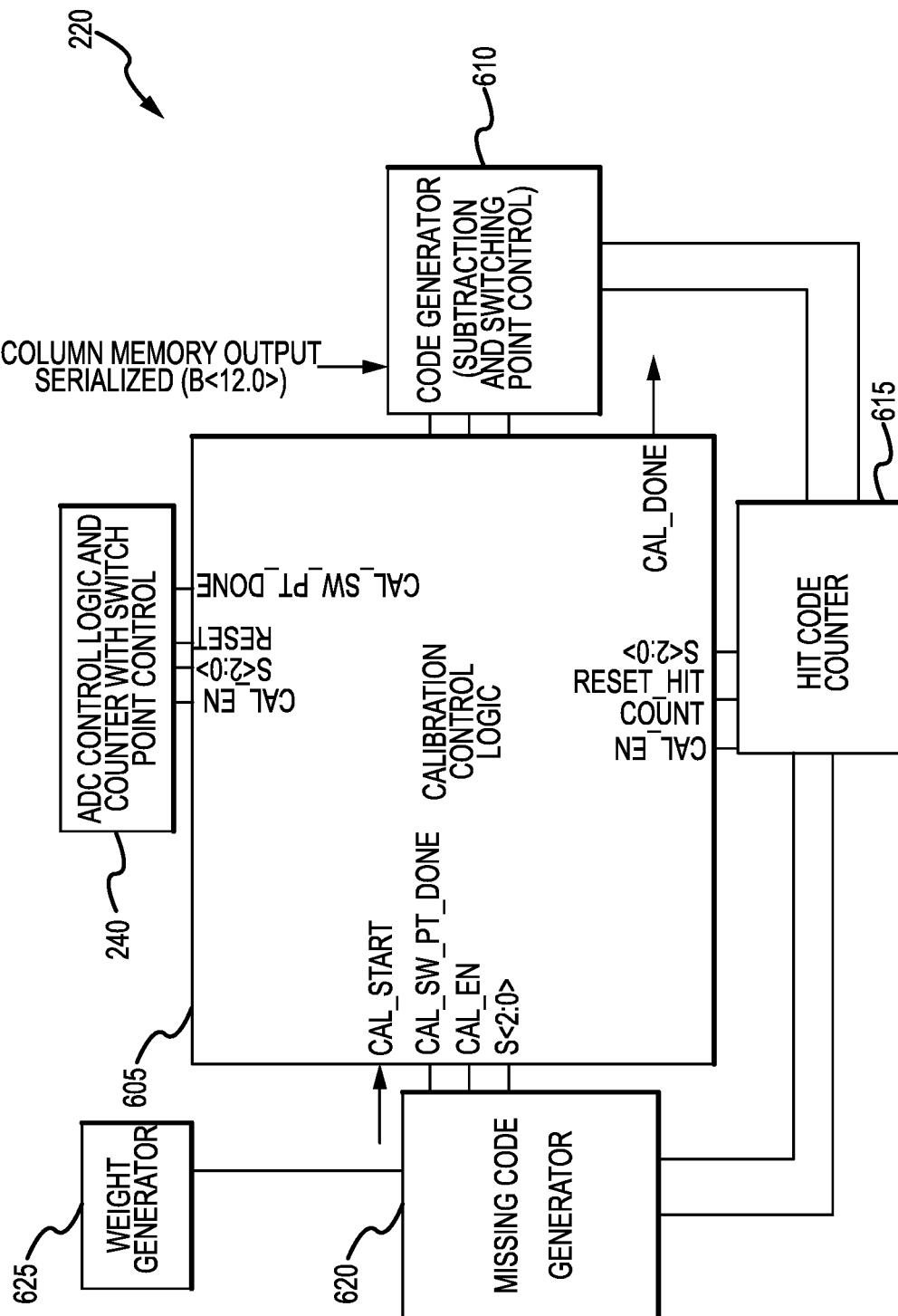
Figure 7:
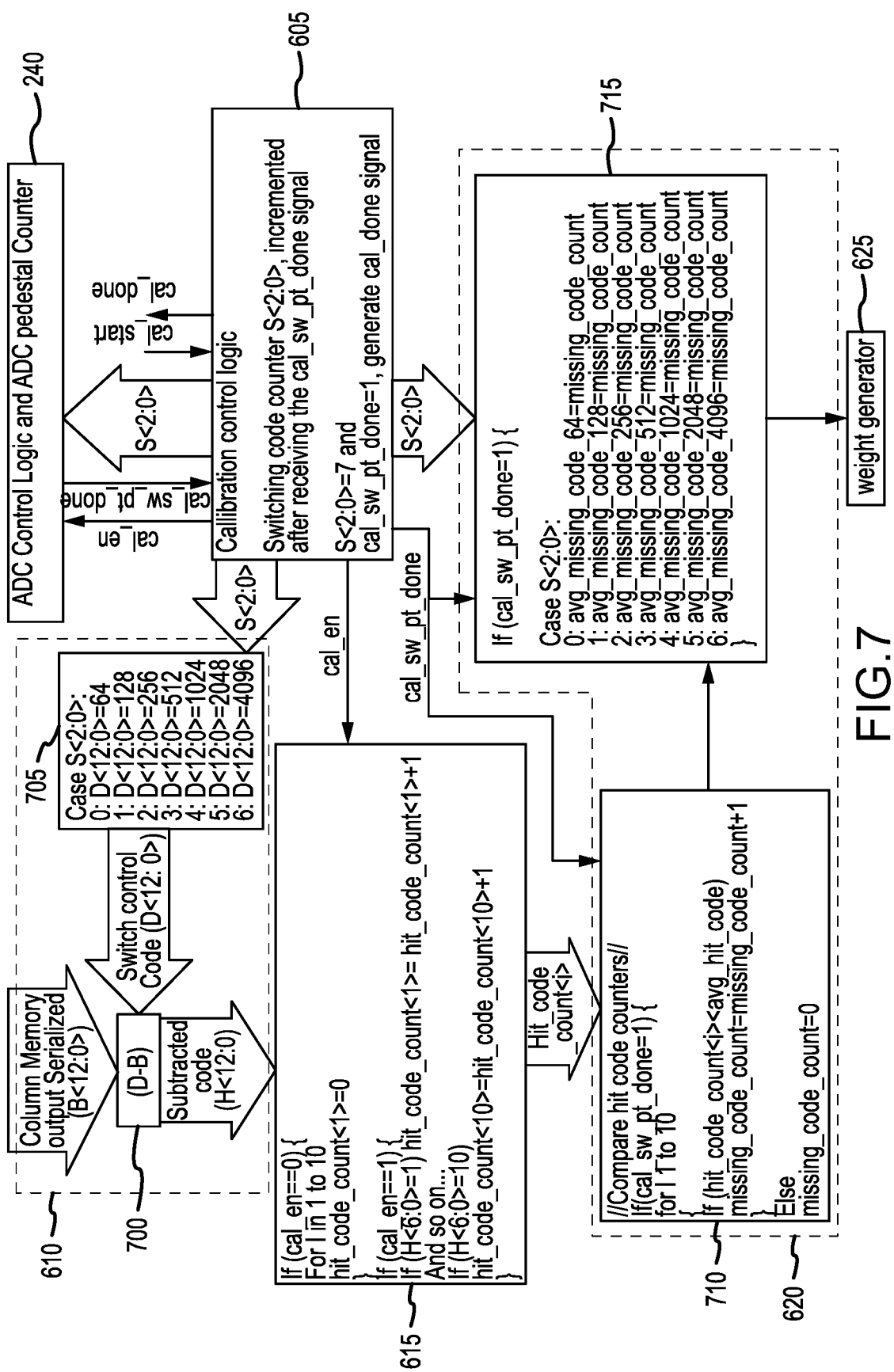
Figure 8:
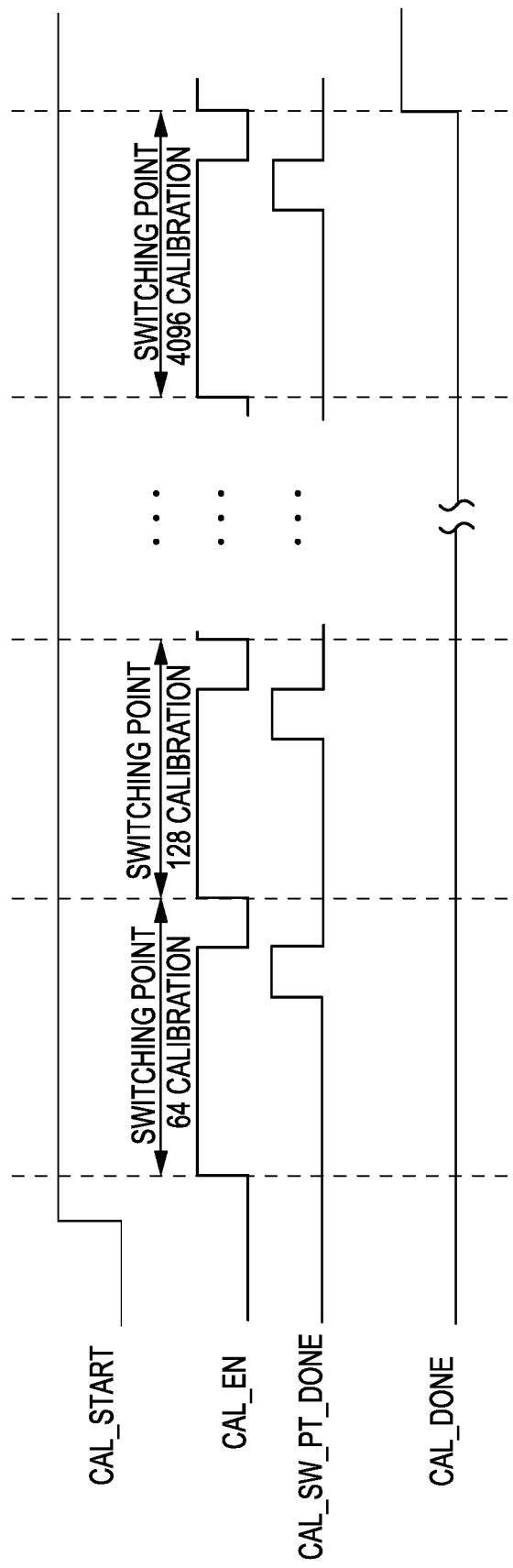
Figure 9:
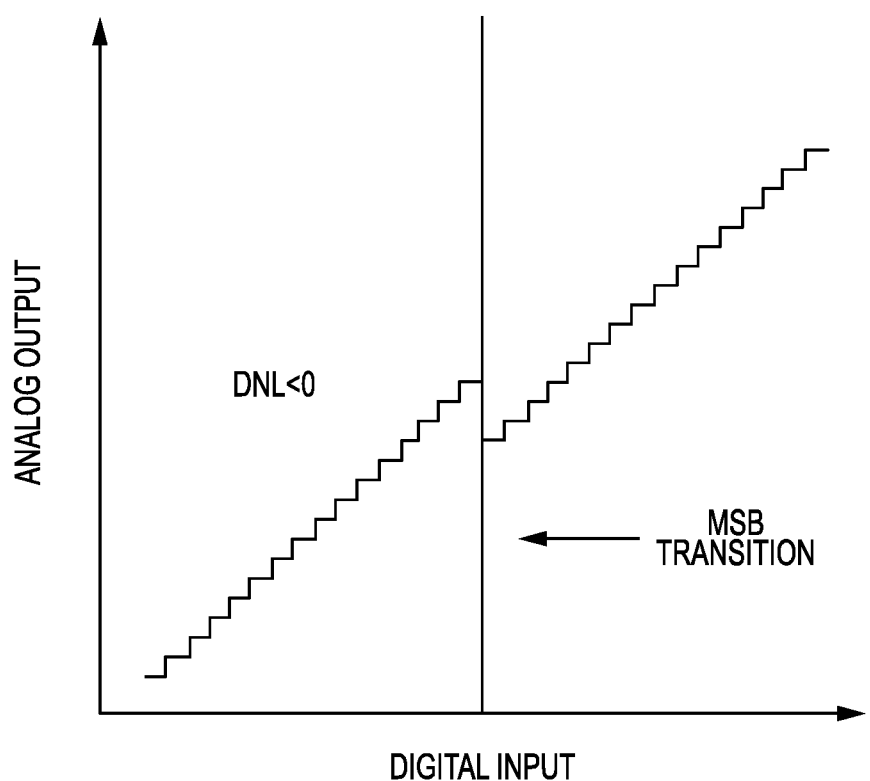

FIG. 4 representatively illustrates a DNL curve of a conventional SAR ADC without calibration;

FIG. 5 representatively illustrates a DNL curve of the SAR ADC of FIG. 3 with calibration and in accordance with an exemplary embodiment of the present technology;

FIG. 6 is a block diagram of a first calibration circuit in accordance with an exemplary embodiment of the present technology;

FIG. 7 is a functional diagram of the first calibration circuit in accordance with an exemplary embodiment of the present technology;

FIG. 8 is a timing diagram for operating the first calibration circuit in accordance with an exemplary embodiment of the present technology; and FIG. 9 is a SAR ADC output curve illustrating negative differential non-linearity.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various controllers, amplifiers, signal converters, drivers, switching devices, current sources, voltage sources, logic gates, semiconductor devices, such as transistors, capacitors, and the like, which may carry out a variety of functions. In addition, the present technology may be integrated in any number of electronic systems, such as imaging systems, automotive, aviation, "smart devices," portables, and consumer electronics, and the systems described are merely exemplary applications for the technology.

Figure 1:
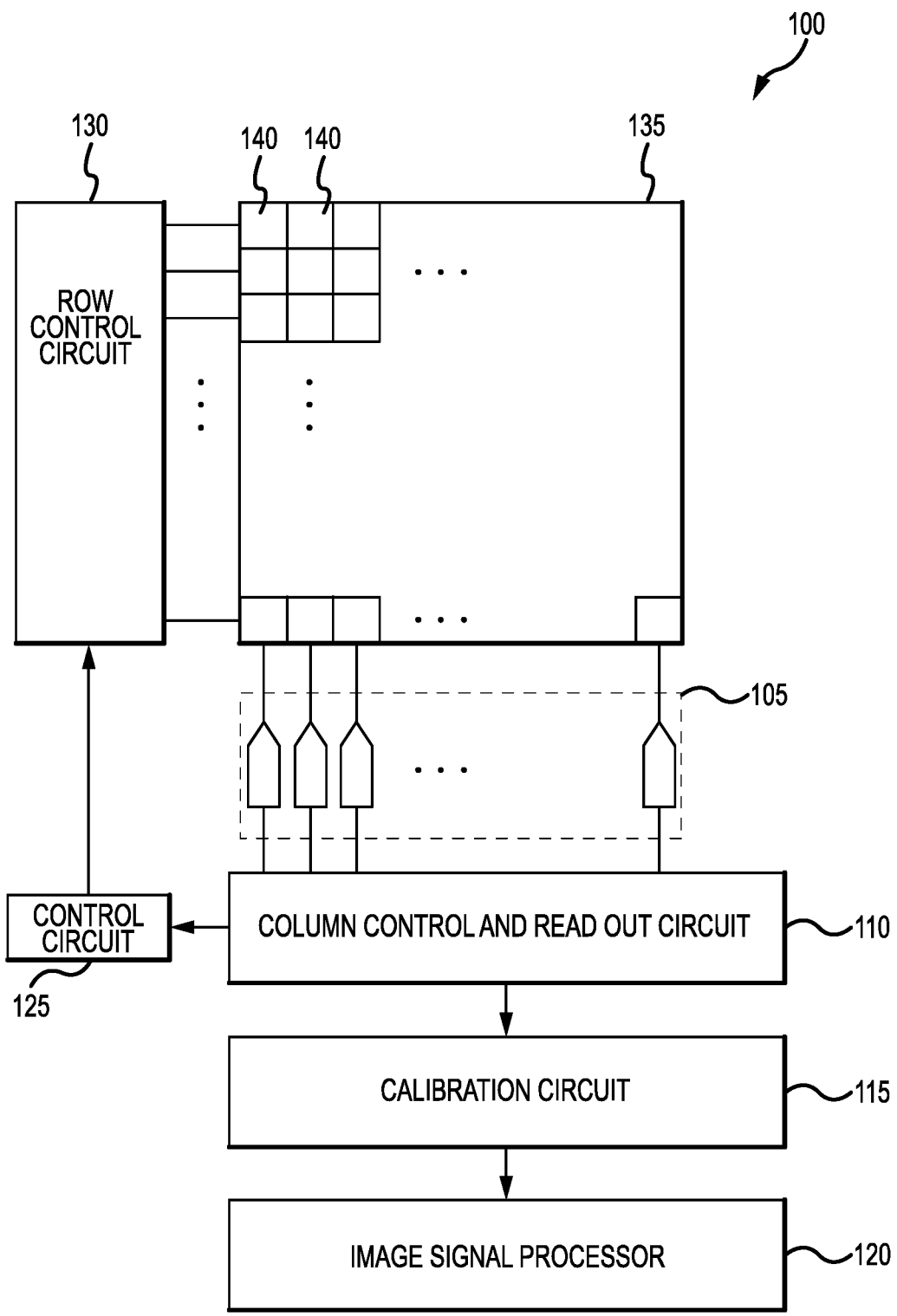
FIG. 1 is a block diagram of a system according to various embodiments of the present technology.
Figure 2:
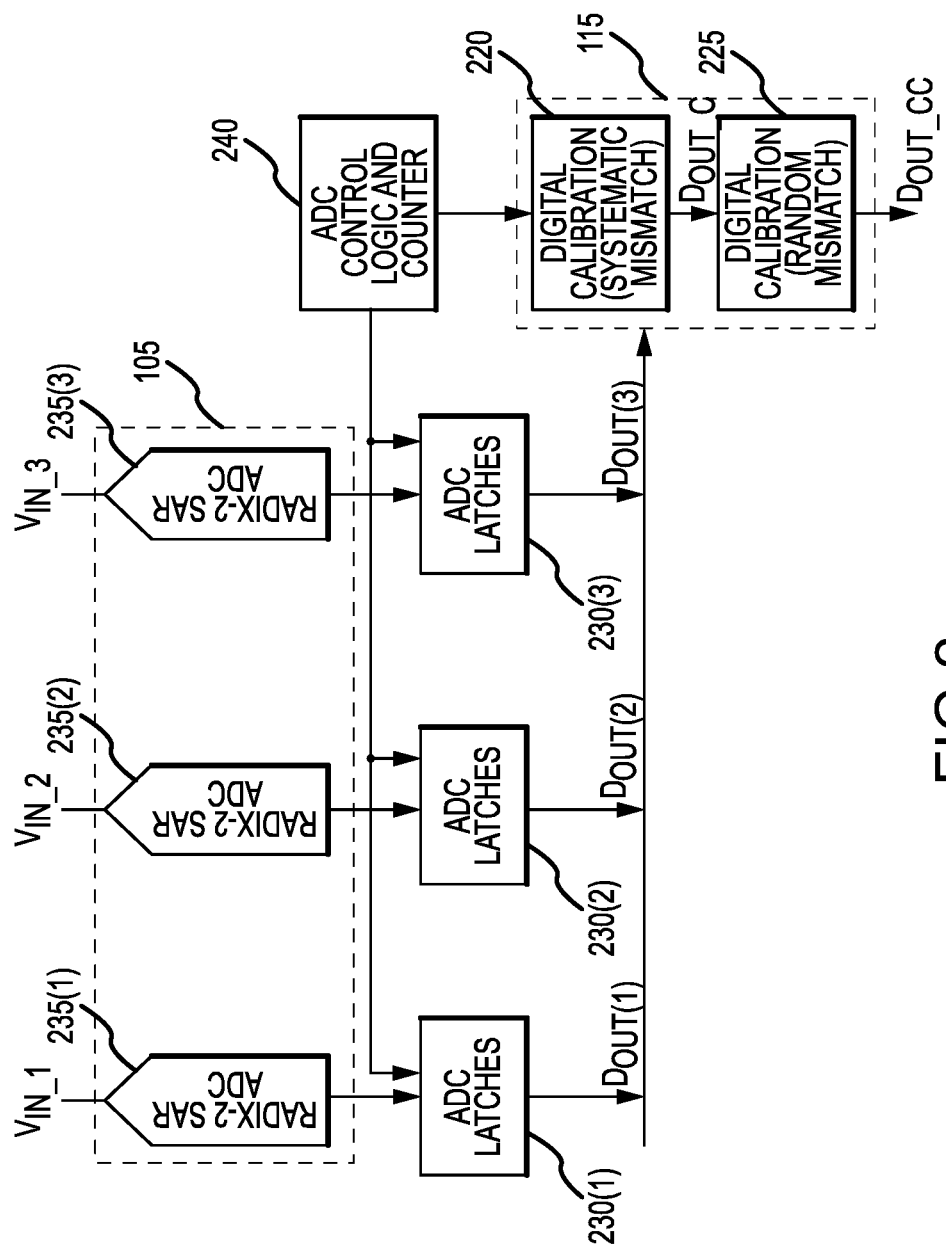
FIG. 2 is a block diagram of a SAR ADC system in accordance with an exemplary embodiment of the present technology.

Referring to FIGS. 1 and 2, embodiments of the present technology may be incorporated in any system, such as an imaging system 100. In an exemplary embodiment, the imaging system 100 may comprise a pixel array 135, a set of analog-to-digital converters (ADCs) 105, a column control and readout circuit 110, a control circuit 125, a row control circuit 130, a calibration circuit 115, and an image signal processor 120.

The pixel array 135 may comprise individual pixels 140 arranged in rows and columns, and the pixel array 135 may contain any number of rows and columns, for example, hundreds or thousands of rows and columns.

The control circuit 125 may be connected between the column control and readout circuit 110 and the row control circuit 130 and may be configured to selectively activate sequential rows of pixels to be read out via the row control circuit 130.

In an exemplary embodiment, the row control circuit 130 may receive row addresses from the control circuit 125 and supply corresponding row control signals, such as reset, row select, charge transfer, and readout control signals to the pixels 140 over row control paths.

In an exemplary embodiment, the column control and readout circuit 110 may be configured to control readout pixel data from the pixel array 135, sample, and/or temporarily store the pixel data read out from the pixel array 135. According to an exemplary embodiment, the column control and readout circuit 110 may comprise a set of latch circuits 205, such as latch circuits 230(1):230(3), that operate in conjunction with a global ADC controller 240 to temporarily store data, selectively enable/disable a respective ADC from the set of ADCs 105, and/or to control signal flow to the calibration circuit 115. In an exemplary embodiment, the column control and readout circuit 110 may further comprise the ADC controller 240.

According to an exemplary embodiment, each latch circuit 230(1):230(3) may operate according to the ADC controller 240. Each latch circuit 230 may be connected to a respective ADC from the set of ADCs 105. Each latch circuit 230 may comprise any suitable latch circuit, such as a flip-flop circuit or the like.

The ADC controller 240 may comprise an ADC logic circuit (not shown) and an ADC counter (not shown). The first logic circuit may generate various operation signals, such as a signal indicating that the calibration switch point is completed (i.e., "cal_sw_pt_done"). In addition, the ADC counter may provide a count value to each latch circuit 230 simultaneously.

The ADC controller 240 may comprise any number of circuits and/or systems suitable for generating signals and/or count values of a specified event. For example, the ADC controller may comprise logic circuits, logic gates, a conventional counter circuit, and the like.

In an exemplary embodiment, the set of ADCs 105 receives analog signals $V_{IN}$, such as analog pixel signals from the pixel array 135, and converts the analog signals into corresponding digital outputs $D_{OUT}$. According to various embodiments, the set of ADCs 105 may comprise a plurality of analog-to-digital converters 235(1):235(3), wherein each column of the pixel array 135 is associated with one ADC 235 from the set of ADCs 105.

According to various embodiments of the present technology, and referring to FIGS. 2 and 3, each ADC 235 from the set of ADCs 105 may comprise a successive approximation register analog-to-digital converter (SAR ADC). According to various embodiments, each ADC 235 may be configured as a radix-2 SAR ADC. In an exemplary embodiment, each ADC 235 may comprise a plurality of switched capacitors 320 that are selectively operated to generate the ADC output. Each ADC 235 may further comprise a latched comparator 315 comprising an amplifier 305 and a latch 310 that operate together to amplify a voltage on the switched capacitors 320 and generate a corresponding digital output $D_{OUT}$ (i.e., a digital code), wherein the digital output $D_{OUT}$ is represented using a number of bits. Each ADC 235 may be configured to generate any number of output bits. For example, the number of desired output bits may be proportional to the number of switched capacitors 320.

The calibration circuit 115 may be configured to calibrate an ADC output. For example, the calibration circuit 115 may be configured to compensate for missing codes in the digital output $D_{OUT}$ due to capacitor mismatch and non-linearity and generate a corrected digital output $D_{OUT\_C}$. According to an exemplary embodiment, the calibration circuit 115 may be configured to perform a first calibration to compensate for systematic mismatch and perform a second calibration to compensate for random mismatch. In an exemplary embodiment, the calibration circuit 115 performs the first calibration prior in time to the second calibration.

Referring to FIGS. 2, 6, and 7, according to various embodiments, the calibration circuit 115 may comprise a first calibration circuit 220 configured to identify the missing codes causing the non-linearity, generate a weight for each missing code, and generate a first corrected digital output $D_{OUT\_C}$ according to the weights.

The first calibration circuit 220 may comprise a calibration controller 605, a code generator 610, a code counter 615, a missing code generator 620, and a weight generator 625. The calibration controller 605 may be configured to receive, generate and/or transmit signals. For example, the calibration controller 605 may comprise a switch code counter (not shown) configured to generate a switching point code S<2:0>. The calibration circuit 605 may also generate a calibration enable signal ("cal_en") upon receiving a calibration start signal ("cal_start"). The calibration start signal may initiate the calibration controller 605 to transmit various signals to the ADC controller 240, the code generator 610, the code counter 615, and the missing code generator 620. The calibration controller 605 may also transmit a signal indicating that the first calibration has been completed ("cal_done").

In an exemplary embodiment, the calibration controller 605 may receive the switch point signal ("cal_sw_pt_done") from the ADC controller 240 and transmit the calibration enable signal ("cal_en") to the ADC controller 240. The calibration controller 605 may generate and transmit the calibration enable signal to the code counter 615 and the missing code generator 620. The calibration controller 605 may transmit the switch point signal ("cal_sw_pt_done") to the weight generator 620 and the missing code generator 620. The calibration controller 605 may also transmit the switching point code S<2:0> to the code generator 610. In an exemplary embodiment, the switching point code S<2:0> may be represented as a 3-bit binary code with corresponding decimal values from 0 to 7.

The code generator 610 may be configured to receive digital outputs $D_{OUT}$ from the ADC latches 230 in a serial manner. For example, the first calibration circuit 220 may receive a first digital output $D_{OUT\_1}$, then a second digital output $D_{OUT\_2}$, then a third digital output $D_{OUT\_3}$, etc. Each digital output $D_{OUT}$ may be represented as a code having a number of bits (B<12:0>), in this case 13 bits. The code generator 610 may comprise a subtraction circuit 700 and a set of switch control codes 705. The set of switch control codes 705 may comprise 7 codes, each represented as a digital value D<12:0> based on the switching point code S<2:0>. The code generator 610 may select one of the switch control codes D<12:0> based on the switching point code S<2:0> received from the calibration controller 605. The subtraction circuit 700 may be configured to subtract the switch control code D<12:0> from the digital output code B<12:0> to generate a subtracted code H<12:0>.

The code counter 615 may be connected to the calibration controller 605 and the code generator 610 and configured to receive the calibration enable signal ("cal_en") and a portion of the subtracted code H<6:0> (i.e., bits to 0 to 6). The code counter 615 may generate a hit code count ("hit_code_count<i>"). For example, if the calibration enable signal is asserted (i.e., cal_en=1), then the code counter increments the hit_code_count value by 1 and outputs the current count value ("hit_code_count<i>").

The missing code generator 620 may be configured to determine the missing codes in the digital output $D_{OUT}$ for each switching point by comparing the hit code count to an average hit code ("avg_hit_code") and store the missing code count according to the switching point code S<2:0>. In an exemplary embodiment, the missing code generator 620 may comprise a comparator 710 and a set of registers 715 to store the missing code counts.

The comparator 710 may be configured to receive the hit code count ("hit_code_count<i>") and compare the hit code count ("hit_code_count<i>") to an average hit code to determine the missing code count ("missing_code_count"). For example, if the hit code count ("hit_code_count<i>") is less than the average hit code, then the missing code count is incremented by 1, otherwise the missing code count ("missing_code_count") is set to zero. The average hit code is determined from the number of times the code counter swept around the switching point for each count.

The set of registers 715 may be used to store the missing code count according to the switching point code S<2:0>. The set of registers 715 may comprise any number of registers, wherein each register is used to store the missing code count for a particular switching point. For example, if the switch point signal ("cal_sw_pt_done") is asserted (i.e., cal_sw_pt_done=1), and the switching point is at 64, then the missing code count may be saved to a first register ("0") from the set of registers 715. If the switch point signal ("cal_sw_pt_done") is asserted (i.e., cal_sw_pt_done=1), and the switching point is at 128, then the missing code count may be saved to a second register ("1") from the set of registers 715, etc. The missing code count values for each switching point may be represented as variables C7, C8, C9, C10, C11, and C12, where C7 is the missing code at a second switching point (e.g., at the seventh MSB of the ADC output), C8 is the missing code at a third switching point (e.g., at the eighth MSB of the ADC output), C9 is the missing code at a fourth switching point (e.g., at the ninth MSB of the ADC output), C10 is the missing code at a fifth switching point (e.g., at the tenth MSB of the ADC output), C11 is the missing code at a sixth switching point (e.g., at eleventh MSB of the ADC output), and C12 is the missing code at a seventh switching point (e.g., at the twelfth MSB of the ADC output).

The weight generator 625 may be configured to compute a weight W based on the missing codes. For example, once the first calibration circuit 220 has identified the missing codes ("missing_code_count") at each switching point, the first calibration circuit 220 may compute a plurality of weights WN, which represent a sum of the non-linearity errors (e.g., differential non-linearity (DNL)), add the weights together to generate a total weight, and subtract the total weight from the digital output $D_{OUT}$.

In various embodiments, the sum of the DNL errors for a range of bits may be used to determine the plurality of weights WN. The sum of the DNL errors for each weight may be computed using the missing codes. For example, the weight calculation for the most significant bits from 7 to 12 in a 13-bit ADC may be described as follows:

Assume missing codes at b7 switching (b<7: 0>="10000000")=C7, at b8 switching (b<8: 0>="100000000")=C8, b9 switching (b<9: 0>="100000000")=C9, at b10 switching (b<10: 0>="1000000000")=C10, at b11 switching (b<9: 0>="100000000")=C11, and at b12 switching (b<10: 0>="1000000000")=C12. The first calibration circuit 220 may compute weights W7, W8, W9, W10, W11, and W12 according to the missing codes at each switching point. For example:

W7=sum of DNL from b6 to b0=missing code at b7 switching=C7.
W8=sum of DNL from b7 to b0;
 Therefore, W8=(C7+C7+C8)−W7=C7+C8.
W9+W8+W7=sum of DNL from b8 to b0;
 Therefore, W9=(C7+C7+C8+C7+C8+C9)−W8−W7=C9+C8+2*C7.
W10+W9+W8+W7=sum of DNL from b9 to b0;
 Therefore, W10=(C7+C7+C8+C7+C8+C9+C7+C8+C9+C10)−W9−W8−W7=C10+C9+2*C8+4*C7.
W11+W10+W9+W8+W7=sum of DNL from b10 to b0;
 Therefore,
 W11=(C7+C7+C8+C7+C8+C9+C7+C8+C9+C10+C7+C8+C9+C10+C11)−W10−W9−W8−W7;
 Therefore, W11=C11+C10+2*C9+4*C8+8*C7.
W12+W11+W10+W9+W8+W7=sum of DNL from b11 to b0;
 Therefore,
 W12=(C7+C7+C8+C7+C8+C9+C7+C8+C9+C10+C7+C8+C9+C10+C11+C7+C8+C9+C10+C11+C12)−W11−W10−W9−W8−W7;
 Therefore, W12=C12+C11+2*C10+4*C9+8*C8+16*C7.

After the weights W7, W8, W9, W10, W11, and W12 are computed, the original digital output $D_{OUT}$ may be corrected by multiplying the weights by the respective bit in the digital output $D_{OUT}$ to generate a total weight and subtracting the total weight from the original digital output $D_{OUT}$. For example, the first corrected ADC output $D_{OUT\_C}$=b<12:0>−(W7*b<7>+W8*b<8>+W9*b<9>+W10*b<10>+W11*b<11>+W12*b<12>); where b<12:0> is the original digital output $D_{OUT}$ from the ADC 235.

According to various embodiments, the calibration circuit 115 may comprise a second calibration circuit 225 to perform calibration on the first corrected digital output $D_{OUT\_C}$ by compensating for random mismatch and generating a second corrected digital output $D_{OUT\_CC}$. In an exemplary embodiment, the second calibration circuit 225 may be connected to an output of the first calibration circuit 220 and receive the first corrected digital output $D_{OUT\_C}$. According to an exemplary embodiment, the second calibration circuit 225 may be configured to randomize the ADC codes around the switching points. For example, the second calibration circuit 225 may be configured to perform a dither algorithm, such as the following:

If ((adc_code<range_mid) & (adc_code>=range_min))
 adc_code_new_random=adc_code+randi([0,range_mid−adc_code]);
 //add a random number between 0 and difference of adc_code and range_mid
If ((adc_code>range_mid) & (adc_code<=range_max))
 adc_code_new_random=adc_code−randi([0,adc_code−range_mid]);
 //subtract a random number between 0 and difference of adc_code and range_mid
If((adc_code<range_min) OR (adc_code>range_max))
 adc_code_new_random=adc_code; //Do nothing In the above algorithm, "adc_code" is the first corrected digital output $D_{OUT\_C}$, range_mid is a mid-range value, range_min is a minimum value, and range_max is a maximum value. In general, the mid-range value is $2^N-2$, where N is the bit position, the minimum value is $2^N-4$, and the maximum value is $2^N$. For example: for 1024 (bit 10) bit switching, the mid-range value may be equal to 1022, the maximum value may be equal to 1024, and the minimum value may be equal to 1020, with a maximum 4 missing codes, the algorithm will dither the missing codes that are between 1024 to 1022 and 1022 to 1020, which will randomize the ADC codes around the switching points and will reduce the column fixed pattern noise.

The second calibration circuit 225 may comprise any hardware, software, or a combination thereof, suitable for adding and/or subtracting random numbers from the ADC code.

In operation, and referring to FIGS. 1-8, embodiments of the present technology may convert an analog signal to a digital output, identify missing codes in the digital output, compute weights for each switching point, and use the weights to calibrate the digital output. Embodiments of the present technology may use a dither algorithm to provide more precise calibration of the digital output.

According to various operations, the ADC controller 240 may be used to load a DAC (digital-to-analog converter) of the ADC's 235 around the switching point to determine the missing codes. The missing codes may then be used to compute the weights at each switching point. In an image system application, the first calibration may be done during an initialization period, before the start of any pixel readout, and the weights may be stored and reused to compute a corrected (i.e., calibrated) code during pixel integration (during live image signal processing).

According to an exemplary operation, and referring to FIGS. 1-3 and 6-8, the system 100 may perform a number of operation phases. For example, initially, the ADC's may undergo a sampling phase and a conversion phase. The sampling phase and the conversion phase may be performed according to conventional sampling and conversion techniques. After the sampling phase and the conversion phase, the system 100 may perform a calibration phase to determine the missing codes.

The system 100 may, upon initial start-up, initiate the calibration phase by generating the calibration start signal. For example, the main controller may generate the calibration start signal and transmit the signal to the calibration controller 605. After the calibration controller 605 receives the calibration start signal, the calibration controller 605 may generate and transmit the calibration enable signal to the ADC controller 240, the code counter 615, and the missing code generator 620. The calibration controller 605 may also transmit the switching point code S<2:0> to the ADC controller 240 to the initialize the ADC controller 240. In an exemplary embodiment, the ADC counter may be reset to the switching point of interest minus a first offset value (i.e., code(S<2:0>)−offset1; where code(0)=64, code(1)=128 . . . code(6)=4096. For example, if the first offset (offset1) is set to 30 codes, then the ADC counter is set to (64−30), (128−30), (256−30), (512−30), (1024−30), (2048−30) or (4096−30)). The ADC counter may be incremented by one for every ADC conversion cycle for each switching point code (i.e., code(0) through code(6)). According to an exemplary embodiment, each ADC conversion cycle is repeated approximately 20 (used as average hit code) times to eliminate the effect of ADC noise.

After each ADC conversion cycle, the column control and readout circuit 110 may transmit the ADC outputs $D_{OUT}$ to the calibration circuit 115 in a serial manner. For example, the column control and readout circuit 110 may transmit the digital outputs $D_{OUT}$ from each ADC 235 to the code generator 610, wherein the code generator 610 subtracts the switch control code D<12:0> from the digital output code B<12:0> to generate the subtracted code H<12:0>. The code generator 610 may then transmit the subtracted code H<12:0> to the code counter 615, wherein the code counter 615 generates the hit code count according to the calibration enable signal and a portion of the subtracted code H<6:0>. The code counter 615 may then transmit the hit code count ("hit_code_count<i>") to the missing code generator 620.

The system 100 may repeat the operations for sampling, conversion, subtraction, and determining the hit code count for ADC counter values from a first count (where the first count is defined as: code (S<2:0>)−offset1) to a second count (where the second count is defined as: code (S<2:0>)+offset2, where offset2 is a second offset value, such as 50). Once the ADC counter value reaches the second count value, the ADC controller 240 may generate the switch point signal ("cal_sw_pt_done"), which may be used to increment a switching code counter in the calibration controller 605.

The missing code generator 620 may then compare the hit code count ("hit_code_count<i>") to the average hit code ("avg_hit_code"), as described above, to determine the missing code(s). After the missing code(s) from the digital output $D_{OUT}$ has been determined, the missing code for each switching point may be stored in a respective register (i.e. avg_missing_code_*) based on the switching point code S<2:0>.

The system 100 may repeat the operations of sampling, conversion, subtraction, determining the hit_code_count, determining the missing_code_count, and incrementing the ADC counter for all switching point codes from S<2:0>=0 to S<2:0>=7.

The weight generator 625 may then retrieve the missing code values from the registers and compute the plurality of weights WN, as described above. The system 100 may then use the computed weights to correct subsequent digital outputs and generate the corrected digital output $D_{OUT\_C}$.

In various embodiments, the calibration circuit 115 may also perform the second calibration on each corrected digital output $D_{OUT\_C}$ to correct for the missing codes (as determine above) by adding new codes in the location of the missing codes. For example, the calibration circuit 115 may perform the dither algorithm described above.

Referring to FIG. 4, a conventional SAR ADC may have missing codes that occur due to systematic mismatch. In contrast, and referring to FIG. 5, embodiments of the present technology do not have any missing codes after digital calibration by the first and second calibration circuits 220, 225.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A calibration circuit, configured to connect to a set of analog-to-digital converters (ADCs) and receive an ADC output code from each ADC, wherein the ADC output code has errors, comprising:
    a first calibration sub-circuit configured to perform a first calibration on each ADC output code comprising: compensating for systemic mismatch using a weight-based method, wherein the systemic mismatch comprises a first error type that is shared among each ADC output; and
    a second calibration sub-circuit connected to the first calibration circuit and configured to perform a second calibration on each ADC output code comprising: compensating for random mismatch by randomizing the ADC output codes around a switching point, wherein the random mismatch comprises a second error type that occurs among different ADC output codes;
    wherein the calibration circuit generates a corrected ADC output code according to the first and second calibrations.

2. The calibration circuit according to claim 1, wherein the weight-based method comprises computing a plurality of weights, computing a total weight by summing the computed plurality of weights, and subtracting the computed total weight from the ADC output code.

3. The calibration circuit according to claim 1, wherein randomizing the ADC output codes around a switching point comprises:
    comparing a total ADC code length to:
        a predetermined first value; and
        a predetermined second value;
    computing a difference value between the total ADC code length and the predetermined first value; and
    adding a random number to the total ADC code length, wherein the random number is in the range of zero to the computed difference value.

4. The calibration circuit according to claim 1, wherein randomizing the ADC output codes around a switching point comprises:
    comparing a total ADC code length to:
        a predetermined first value; and
        a predetermined third value; and
    computing a difference value between the total ADC code length and the predetermined first value; and
    subtracting a random number from the total ADC code length, wherein the random number is in the range of zero to the computed difference.

5. The calibration circuit according to claim 1, wherein the first calibration sub-circuit comprises:
    a logic circuit configured to receive a start signal and initiate the first calibration in response to the start signal; and
    a first control circuit in communication with the logic circuit and configured to:
        receive the ADC output code; and
        subtract a switching point code from the ADC output code to generate a subtracted code.

6. The calibration circuit according to claim 5, wherein the first calibration sub-circuit further comprises a counter in communication with the logic circuit and configured to determine a code count based on the subtracted code and an enable signal.

7. The calibration circuit according to claim 6, wherein the first calibration sub-circuit further comprises a missing code generator in communication with the logic circuit and configured to compare the code count to an average code count to determine a missing code count.

8. The calibration circuit according to claim 7, wherein the first calibration sub-circuit further comprises a weight generator in communication with the logic circuit and configured to assign a weight to the missing_code_count and correct the ADC output code according to the assigned weight.

9. A method for calibrating ADC output codes from a set of analog-to-digital converters (ADCs), comprising:
    performing a first calibration on each ADC output code comprising: compensating for systemic mismatch using a weight-based method, wherein the systemic mismatch comprises a first error type that is common among all ADC output codes;
    performing a second calibration on each ADC output code comprising: compensating for random mismatch by randomizing the ADC output codes around a switching point, wherein the random mismatch comprises a second error type that differs among the ADC output codes;
    generating a corrected ADC output code according to the first and second calibrations.

10. The method according to claim 9, wherein the weight-based method comprises computing a plurality of weights, computing a total weight by summing the computed plurality of weights, and subtracting the computed total weight from the ADC output code.

11. The method according to claim 10, wherein the plurality of weights are computed during an initialization period.

12. The method according to claim 9, wherein randomizing the ADC output codes around the switching point comprises:

comparing a total ADC code length to:
  a predetermined first value;
  a predetermined second value; and
  a predetermined third value;
computing a difference value between the total ADC code length and the predetermined first value;
adding a random number to the total ADC code length if the total ADC code length is:
  less than the first value; and
  greater than or equal to the second value; and
subtracting the second random number from the total ADC code length if the total ADC code length is:
  greater than the first value; and
  less than or equal to the third value;
wherein the random number is in the range of zero to the computed difference value.

13. The method according to claim 9, further comprising generating a count value and utilizing the count value to load the ADCs at the switching point.

14. An imaging system, comprising:
  a pixel array comprising a plurality of columns of pixels;
  a set of radix-2 successive approximation register analog-to-digital converters (SAR ADCs); wherein each SAR ADC:
    is connected to a respective column from the plurality of columns; and
    generates an ADC output code;
  a calibration circuit connected to the set of SAR ADCs and configured to:
    perform a first calibration on each ADC output code comprising: compensating for systemic mismatch using a weight-based method, wherein the systemic mismatch is a first error type that is shared among all ADC output codes; and
    perform a second calibration on each ADC output comprising: compensating for random mismatch using a dither algorithm, wherein the random mismatch is a second error type that differs among the ADC output codes; and
    generate a corrected ADC output code for each ADC output code according to the first and second calibrations; and
  an image signal processor connected to the calibration circuit and configured to process image data from the pixel array according to the corrected ADC output codes.

15. The imaging system according to claim 14, wherein the weight-based method comprises computing a plurality of weights, computing a total weight by summing the computed plurality of weights, and subtracting the computed total weight from the ADC output code.

16. The imaging system according to claim 14, wherein the calibration circuit comprises:
  a logic circuit configured to receive a start signal and initiate the first calibration in response to the start signal; and
  a first control circuit in communication with the logic circuit and configured to:
    receive the ADC output code; and
    subtract a switching point code from the ADC output code to generate a subtracted code.

17. The imaging system according to claim 14, wherein the calibration circuit further comprises:
  a counter in communication with the logic circuit and configured to determine a code count based on the subtracted code and an enable signal;
  a missing code generator in communication with the logic circuit and configured to compare the code count to an average code count to determine a missing_code_count; and
  a weight generator in communication with the logic circuit and configured to assign a weight to the missing_code_count and correct the ADC output code according to the assigned weight.

18. The imaging system according to claim 14, further comprising a set of control circuits, wherein each control circuit is connected to and configured to control operation of a respective SAR ADC from the set of SAR ADCs; and transmit the ADC output code to the calibration circuit.

19. The imaging system according to claim 14, further comprising a counter connected to the set of control circuits and controls a switching point of the SAR ADC.

20. The imaging system according to claim 14, wherein the calibration circuit performs the first and second calibrations prior to readout of pixel signals from the pixel array.

* * * * *